United States Patent
Lam

(10) Patent No.: US 8,531,022 B2
(45) Date of Patent: Sep. 10, 2013

(54) ROUTABLE ARRAY METAL INTEGRATED CIRCUIT PACKAGE

(75) Inventor: Ken M. Lam, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 197 days.

(21) Appl. No.: 12/399,200

(22) Filed: Mar. 6, 2009

(65) Prior Publication Data

US 2010/0224981 A1 Sep. 9, 2010

(51) Int. Cl.
*H01L 23/22* (2006.01)
*H01L 23/24* (2006.01)

(52) U.S. Cl.
USPC .......................................... 257/687; 257/700

(58) Field of Classification Search
USPC ................................. 257/687, 700
See application file for complete search history.

(56) References Cited

U.S. PATENT DOCUMENTS

| | | | |
|---|---|---|---|
| 5,830,800 A | | 11/1998 | Lin |
| 6,001,671 A | * | 12/1999 | Fjelstad ................. 438/112 |
| 6,238,952 B1 | * | 5/2001 | Lin ......................... 438/110 |
| 6,635,957 B2 | * | 10/2003 | Kwan et al. .............. 257/691 |
| 6,975,022 B2 | * | 12/2005 | Sakamoto et al. ........ 257/676 |
| 7,245,023 B1 | | 7/2007 | Lin |
| 7,626,253 B2 | * | 12/2009 | Onodera et al. ........ 257/686 |
| 2002/0027289 A1 | | 3/2002 | Kurihara et al. |
| 2002/0041019 A1 | * | 4/2002 | Gang ...................... 257/678 |
| 2006/0163702 A1 | * | 7/2006 | Kim et al. ............... 257/666 |
| 2007/0108583 A1 | * | 5/2007 | Shim et al. .............. 257/686 |
| 2008/0093597 A1 | * | 4/2008 | Kiyota ..................... 257/48 |
| 2009/0108423 A1 | * | 4/2009 | Riedl et al. ............... 257/675 |
| 2009/0243054 A1 | * | 10/2009 | Yeung et al. ............ 257/666 |
| 2010/0224971 A1 | | 9/2010 | Li |
| 2012/0025375 A1 | | 2/2012 | Lam |
| 2012/0178214 A1 | | 7/2012 | Lam |

OTHER PUBLICATIONS

International Application Serial No. PCT/US2010/026394, Search Report mailed May 7, 2010, 3 pgs.
International Application Serial No. PCT/US2010/026394, Written Opinion mailed May 7, 2010, 9 pgs.
U.S. Office Action issued in U.S. Appl. No. 12/848,065, filed Jul. 24, 2012, 15 pages.
International Preliminary Report on Patentability issued in PCT/US2010/026394, on Sep. 15, 2011, 11 pages.
Notice of Allowance issued in U.S. Appl. No. 12/848,065, filed Nov. 19, 2012, 5 pages.
U.S. Office Action issued in U.S. Appl. No. 13/426,100, filed Dec. 14, 2012, 23 pages.
Restriction Requirement issued in U.S. Appl. No. 12/848,065, filed Jun. 8, 2012, 5 pgs.
Notice of Allowance issued in U.S. Appl. No. 13/426,100, filed Apr. 18, 2013, 6 pgs.

* cited by examiner

*Primary Examiner* — Phat X Cao
(74) *Attorney, Agent, or Firm* — Fish & Richardson P.C.

(57) ABSTRACT

An integrated circuit assembly comprises an integrated circuit die, and a routable metal layer comprising metal traces linking a plurality of wire bond pads to a plurality of external connection pads such that the metal traces are routable under the die area. An electrically nonconductive adhesive layer couples the integrated circuit die to the routable metal layer, and a plurality of wire bonds link circuitry on the integrated circuit die to the wire bond pads in the routable metal layer. An overfill material encapsulates at least the integrated circuit die and the plurality of wire bonds, and a plurality of solder balls are formed on the plurality of external connection pads.

19 Claims, 7 Drawing Sheets

WIREBOND

OVER-MOLD

Cu ETCH

ROUTABLE ARRAY METAL INTEGRATED CIRCUIT PACKAGE

FIELD OF THE INVENTION

The invention relates generally to integrated circuit packaging, and more specifically to a routable array metal integrated circuit package.

BACKGROUND

Most electronic or computerized devices have electronic circuits that include one or more integrated circuits, often called "chips". These integrated circuits are usually relatively large or complex circuits such as computer processors, memory arrays, or other such devices. The actual circuits in the integrated circuit are typically formed using semiconductor devices formed on a substrate, such as doped silicon transistors, resistors, and capacitors formed on a silicon substrate.

The combination of a substrate and circuitry formed on the substrate is often referred to as a "die", and usually has circuitry that is so small that it is impossible to see the individual electronic components or circuit traces with the naked eye. Due to the small size of the circuit elements formed on the substrate, the die is also relatively fragile and can be easily damaged by scratching. Some circuits that operate at high power, such as high performance processors or controllers, also produce more heat than the integrated circuit die can dissipate, and so are not usable without some means of dissipating generated heat.

For these and other reasons, almost all integrated circuit dice are provided to the manufacturers of devices such as computers or cell phones in packages that are designed to protect the integrated circuit while making it easy to connect to other circuitry. Integrated circuit packages typically include pins, solder balls, or other electrical conductors that are coupled via small lead wires to various parts of the die's electrical circuits, enabling easy and reliable electrical connection from the package's exterior to the die's circuitry. These packages provide a variety functions not related to electrical connection, including carrying heat away from the die to the exterior of the circuit package and perhaps to an external heat sink, and protecting the relatively fragile die from environmental factors such as abrasion, moisture, and shock.

But, packaging an integrated circuit die has several challenges itself. Although a typical integrated circuit die is too small to form connections to without specialized equipment, it is still desirable to keep the size of the packaged die small so that it can be easily integrated into compact or portable electronic devices. The cost of the package is a significant concern, as complex packages that provide good heat management, good protection of the die, and easy connectivity to external circuitry can be a significant part of the cost of a packaged integrated circuit.

It is therefore desired to package integrated circuit dice in a manner that addresses such commercial needs.

SUMMARY

One example embodiment of the invention comprises an integrated circuit assembly including an integrated circuit die, and a routable metal layer comprising metal traces linking a plurality of wire bond pads to a plurality of external connection pads such that the metal traces are routable under the die area. An electrically nonconductive adhesive layer couples the integrated circuit die to the routable metal layer, and a plurality of wire bonds link circuitry on the integrated circuit die to the wire bond pads in the routable metal layer. An overfill material encapsulates the integrated circuit die, the plurality of wire bonds, and one side of the package's external connection pads. A plurality of solder balls are formed on the plurality of external connection pads.

DETAILED DESCRIPTION

In the following detailed description of example embodiments of the invention, reference is made to specific example embodiments of the invention by way of drawings and illustrations. These examples are described in sufficient detail to enable those skilled in the art to practice the invention, and serve to illustrate how the invention may be applied to various purposes or embodiments. Other embodiments of the invention exist and are within the scope of the invention, and logical, mechanical, electrical, and other changes may be made without departing from the subject or scope of the present invention.

Features or limitations of various embodiments of the invention described herein, however essential to the example embodiments in which they are incorporated, do not limit other embodiments of the invention or the invention as a whole, and any reference to the invention, its elements, operation, and application do not limit the invention as a whole but serve only to define these example embodiments. The following detailed description does not, therefore, limit the scope of the invention, which is defined only by the appended claims.

The invention disclosed herein comprises in one example embodiment an integrated circuit assembly comprising an integrated circuit die, and a routable metal layer comprising metal traces linking a plurality of wire bond pads to a plurality of external connection pads such that the metal traces are routable under the die area. An electrically nonconductive adhesive layer couples the integrated circuit die to the routable metal layer, and a plurality of wire bonds link circuitry on the integrated circuit die to the wire bond pads in the routable metal layer. An overfill material encapsulates at least the integrated circuit die and the plurality of wire bonds, and one side of the package's external connection pads. In a further example, a plurality of solder balls are formed on the plurality of external connection pads.

Packaging for integrated circuits is typically designed to protect a relatively fragile integrated circuit die from its environment, to provide reliable electrical connection between the die and external circuitry, and in many cases to carry heat away from the die. Designing the packaging takes into consideration not only physical constraints such as these, but also the cost and complexity of the packaging process and the equipment required to package the dice.

One solution to packaging a die is illustrated in FIGS. 1a-1g, which show a sacrificial metal base strip packaging process. This example process starts by using a metal base strip onto which a package is formed, and from which the completed package is eventually separated.

Figure 1A:
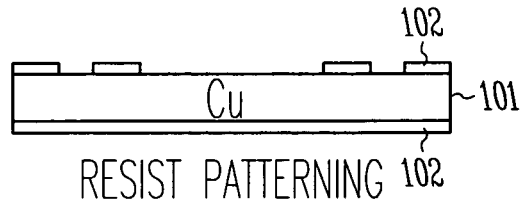
FIGS. 1a-1g show an example integrated circuit assembly fabricated using a sacrificial metal base substrate carrier, consistent with a prior art example.

In FIG. 1a, a copper base strip 101 has a plating resist pattern applied to the surface of the copper base strip, as shown at 102. The bottom side of the copper base strip also has an unpatterned, solid layer of plating resist coating to prevent any plating metal deposition onto the bottom surface. The resist pattern on the top side allows a plating step shown in FIG. 1b to deposit plating material in the patterned resist openings to form wire-bond metal pads 103 and die attach pad 104. In various embodiments, the plating material is one or more metal layers, such as gold, palladium, nickel, and copper. Palladium and gold work well for surfaces of metal layers to which wires will later be bonded, while metals such as nickel or copper are often used for the body of a plating step due to their high conductivity and relatively low cost. Gold is also resistant to oxidation, and so is often used for external plating of metal layers to prevent oxidation of the underlying solderable metal.

Figure 1B:
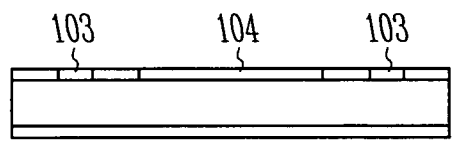
Figure 1C:
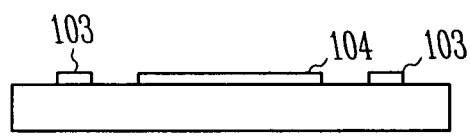
Figure 1D:
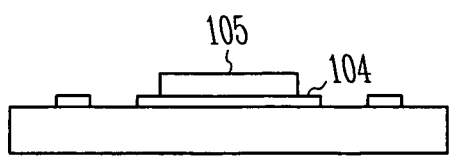

Once the metal plating process is completed, the resist material 102 applied in FIG. 1a is removed in FIG. 1c, leaving only the metal pads 103 and 104 formed in FIG. 1b on the copper strip 101. Here, region 104 forms a base for attachment of the integrated circuit die, as shown in FIG. 1d. The die 105 is attached to the metal plating region 104, such as by use of an epoxy or other adhesive.

Figure 1E:
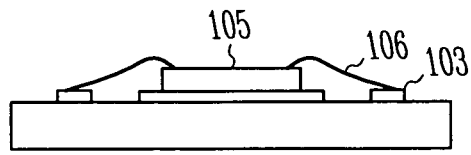

The various circuits on the integrated circuit die are then connected to metal pads 103 formed during the plating process by using fine wire in what is known as a wirebond process. As shown in FIG. 1e, the wires 106 connect various electrical contact points on the integrated circuit die to the metal pads 103, such that the metal pads 103 can be eventually coupled to electrical connections external to the completed package to couple the integrated circuit to external circuitry.

Figure 1F:
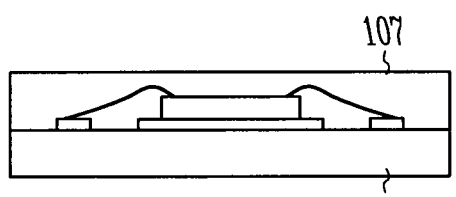

After the die is coupled via the wirebond wires to the metal pads formed in the plating process, the assembly is covered with an over-mold material as shown at 107 in FIG. 1f to encapsulate and protect the die and the wiring and metal pads. This over-mold material is an electrically nonconductive material, such as epoxy or another suitable material.

Figure 1G:
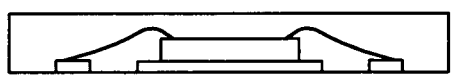

The encapsulated assembly is then processed to remove the sacrificial metal base strip 101 from the assembly, resulting in the die assembly shown in FIG. 1g. The copper base strip in this example is removed from the die assembly by a chemical etch that removes copper efficiently but does not attach to or react with the exposed metal used in the plated metal pads 103 and 104. The metal pads 103 and 104 in the assembly shown in FIG. 1g can then be coupled to the next level board assembly using solder or conductive adhesive compound, or through other means.

The metal pad 104 that supports the die is the same metal that is used to form the pads 103, but no metal pad formed in the plating process of FIG. 1b is connected to any other metal pad. The bond wires shown at 106 of FIG. 1e couple the die's circuits to the metal pads 103, enabling connection to external circuitry. Because the bond wires cannot cross one another without risking electrically coupling one wire to the other due to accidental contact, this packaging system does not provide the ability to cross or route wires to different pads.

Figure 2A:
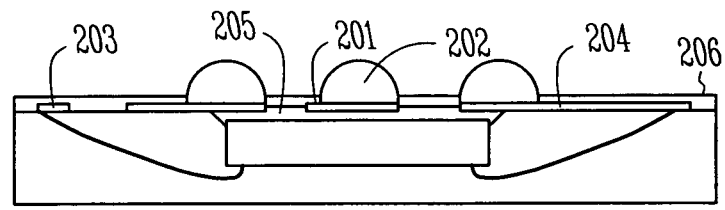
FIG. 2a shows a side view of an integrated circuit assembly having a routable metal layer, consistent with some embodiments of the invention.
Figure 2B:
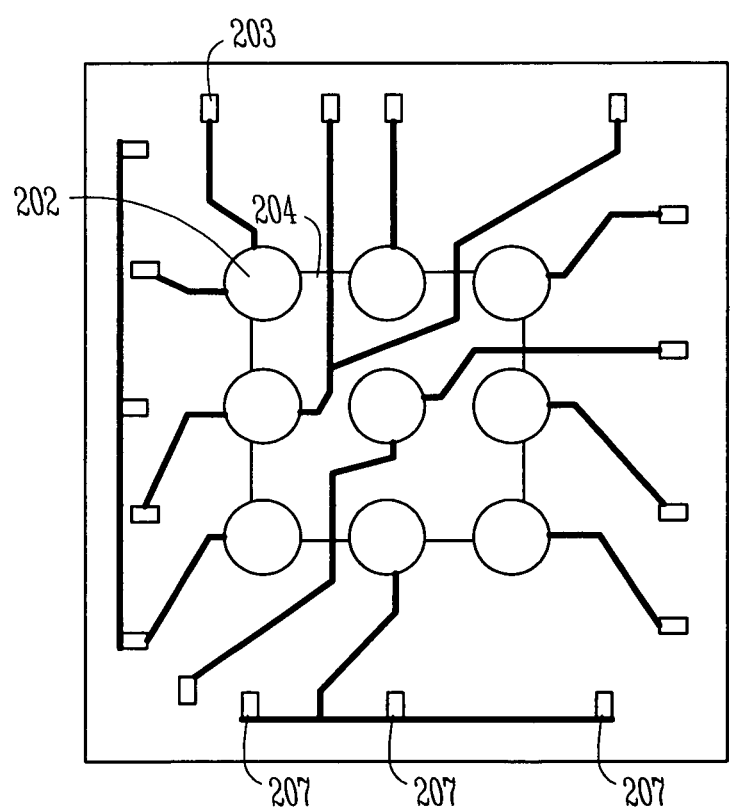
FIG. 2b is a bottom view of the integrated circuit assembly having a routable metal layer of FIG. 2a, consistent with an example embodiment of the invention.

One example embodiment of the invention addresses some problems with the assembly of FIG. 1 by providing a sacrificial metal base strip packaging process that includes a routable layer that is formed by pattern plating. This provides improved flexibility in routing circuit traces to facilitate external connections FIGS. 2a and 2b show a pattern-plated sacrificial metal strip die package including a Ball Grid Array (BGA) format, consistent with an example embodiment of the invention. Other package formats without solder balls are also commonly used. In FIG. 2a, the die package is inverted from the example die package shown in FIG. 1g, and includes a routable metal layer in place of the large pad 104 onto which the die is mounted in FIG. 1.

Here, a routable metal layer of conductive traces 204 is formed on the sacrificial metal layer, including in the area in which the die is mounted. The traces are coupled to the die via wire bond connections to metal wirebond pads 203, which are coupled via the metal layer conductive traces 204 to package pads 201. Solder balls 202 are here formed on package pads 201 in openings in solder mask layer 206, for connection to external circuitry. To prevent the die, which is typically silicon material, from electrically shorting to the package pad metal 201 and metal traces 204, an electrically non-conductive die-attach adhesive material 205, such as epoxy compound, is used for die-attach. This provides a compact, efficient package, with enhanced flexibility in configuration due to the routable metal traces in the metal layer.

A bottom view of the example package of FIG. 2a is shown in FIG. 2b. Here, conductive traces 204 are shown to link various solder balls 202 to various metal wirebond pads 203, such that a wirebond connection from the die to the wirebond pad 203 is electrically coupled via conductive traces 204 to the solder balls 202. Some solder balls, such as power and ground connections, may be connected to multiple pads on the routable metal layer so that multiple power and ground connections can be made between the various circuits on the die and the external power source. An example is shown in FIG. 2b at pads 207, which are coupled to one another and to a single solder ball via metal traces on the routable metal layer.

Figure 3A:
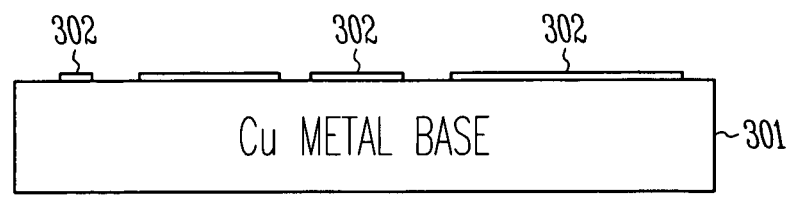
FIGS. 3a-3f illustrate an example method of forming an integrated circuit assembly having a routable metal layer using a sacrificial base layer and localized solder stop, consistent with an example embodiment of the invention.

FIGS. 3a-3f illustrate a method of forming a die package having a routable metal layer using a sacrificial metal strip integrated circuit packaging process, consistent with an example embodiment of the invention. In FIG. 3a, the sacrificial metal strip is a copper metal base 301, and a routable or patterned metal circuit layer 302 is formed on the strip, such as by using a photo-definable plating resist material and photo-mask as described in greater detail with respect to the example of FIG. 1. The metal layer here has one or more layers of metal in a metal-stack, where different types of metal may be used in different layers to provide different properties.

For example, the metal routable layer 302, which comprises wirebonding pad features 203, package pad features 201, and routing trace features 204 as illustrated in FIGS. 2a and 2b, includes in one embodiment a wire-bondable metal on the top surface, such as palladium, silver, or gold. A diffusion barrier metal layer such as nickel is immediately below the wire-bondable metal layer, and a conductive metal such as copper is next. Below that a solder diffusion barrier metal such as nickel is formed, and the bottom layer is an oxidation prevention metal such as silver, gold, or palladium. In alternate embodiments, more layers, other layers, or only select layers from the above example are included in the routable metal layer 302.

Figure 3B:
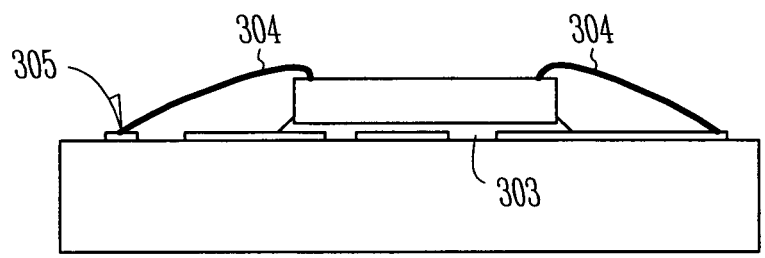

The die is attached to the routable metal layer in FIG. 3b via an electrically nonconductive epoxy layer 303, or via another nonconductive adhesive material. The die is therefore not directly electrically connected to any routable metal traces routed under the die, but is instead coupled to the routable metal layer via bond wires 304. The bond wires 304 are attached to various pads 305, which are coupled via the routable metal layer to external circuit connections.

Figure 3C:
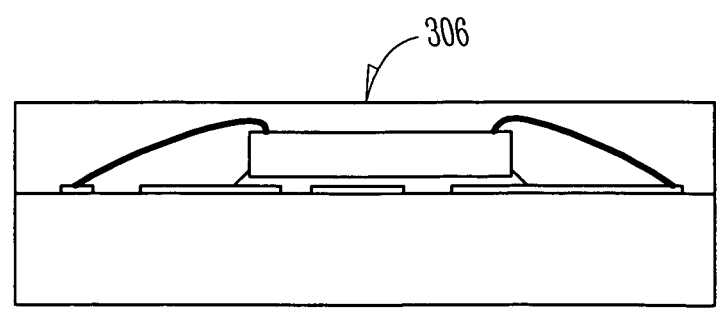
Figure 3D:
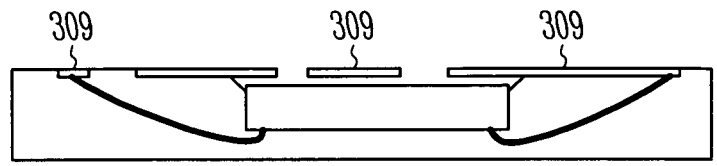

The assembly is then encased as shown in FIG. 3c with an overmold material 306, which protects the die and the bond wires from abrasion, moisture, and other environmental factors. The sacrificial metal strip copper base is then removed as shown in FIG. 3d (shown upside-down), such as by chemical etching. This leaves the routable metal layer and the die-attach epoxy exposed from the overmold applied in FIG. 3c. The sacrificial metal strip is in some examples a long or continuous metal strip that is cut into individual die packages near the end of the packaging process, such as by sawing the metal strip or the die package, as shown in FIG. 5.

Figure 3E:
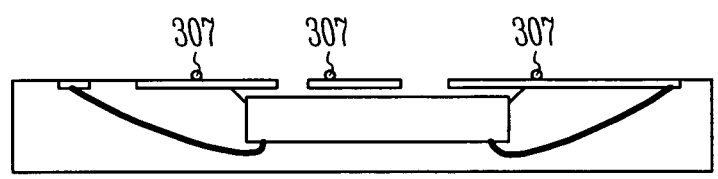

Solder balls are applied to the exposed solder ball regions 309 of the routable metal layer as shown in FIG. 3d. In FIG. 3e, solder stop 307 is applied at various points to constrain solder from flowing onto metal traces 204 during solder ball attachment to the pad areas as shown at 308 in FIG. 3f.

Figure 3F:
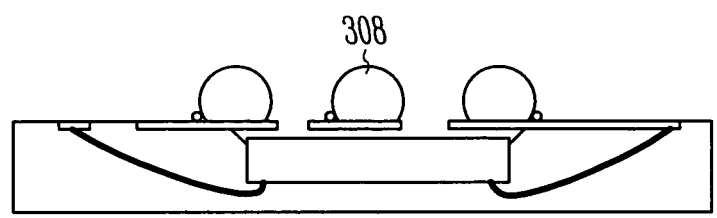
Figure 4A:
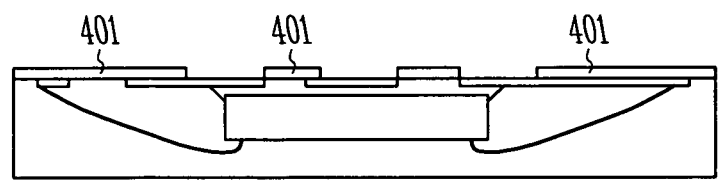
FIGS. 4a-4b illustrate an alternate method of forming an integrated circuit assembly having a routable metal layer using a sacrificial base layer using a full solder mask, consistent with an example embodiment of the invention.
Figure 4B:
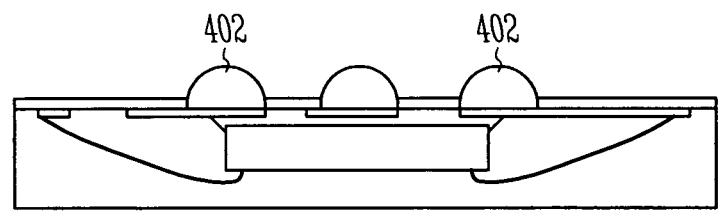

FIGS. 4a and 4b present an alternate method of applying solder balls, using a full solder mask layer instead of solder stop as employed in FIGS. 3e and 3f. In FIG. 4a, a permanent solder mask 401 is applied to the entire bottom side of the integrated circuit package except for the area over the package metal pads that will receive solder balls, as shown at 402 in FIG. 4b. This solder mask layer can be of a photo-definable or non-photo-definable characteristic, in ink or dry-film form, and can be applied using screening or lamination process in various embodiments.

Figure 5:
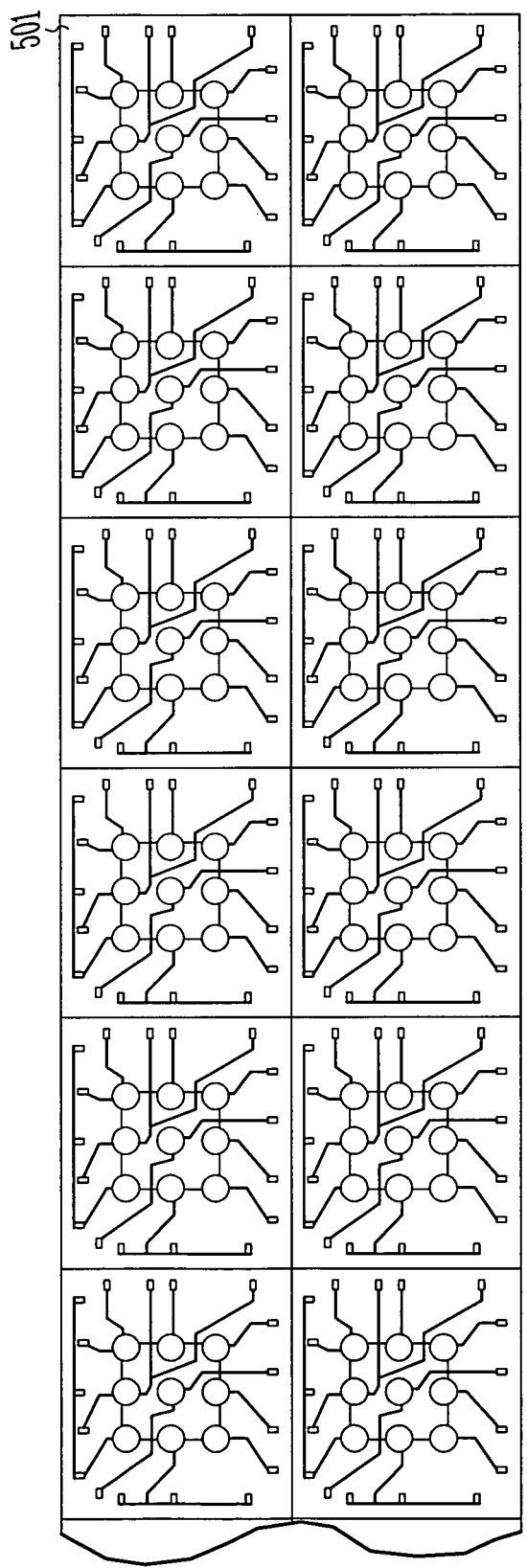
FIG. 5 is a top view of a series of integrated circuit assemblies formed on a sacrificial metal strip base layer, consistent with an example embodiment of the invention.

As previously discussed in the example presented in FIG. 3, a series of integrated circuit assemblies can be formed on a long or continuous sacrificial metal strip base layer, such as is shown in FIG. 5. The individual integrated circuit packages 501 are then separated from one another, such as by sawing, in the final stages of integrated circuit package production.

The routable metal layer integrated circuit assembly technology described herein therefore provides a variety of advantages over prior art integrated circuit mounting technologies such as the example illustrated in FIG. 1, including providing the advantage of full layer routing capability. A typical BGA package uses an organic substrate for routing. Eliminating an organic substrate in the routable metal layer integrated circuit examples illustrated in FIGS. 2-4 makes these examples significantly less expensive than prior technologies, and substantially reduces the height of the finished integrated circuit assembly which allows for thinner devices such as cell phones, personal digital assistant devices, global positioning systems, and other portable or handheld electronic devices.

Although specific embodiments have been illustrated and described herein, it will be appreciated by those of ordinary skill in the art that any arrangement that achieve the same purpose, structure, or function may be substituted for the specific embodiments shown. This application is intended to cover any adaptations or variations of the example embodiments of the invention described herein. It is intended that this invention be limited only by the claims, and the full scope of equivalents thereof.

The invention claimed is:

1. An integrated circuit assembly, comprising:
    an integrated circuit die;
    a routable metal layer comprising routable metal traces configured for coupling wire bond pads to package pads that are configured as a mount for the die, the routable metal layer including at least a pair of metal traces that directly couple a pair of wire bond pads to one another without an intervening package pad under an area on which the die is mounted;
    an electrically nonconductive adhesive layer coupling the integrated circuit die to the routable metal layer such that the integrated circuit die is not directly electrically connected to the metal traces routed under the area on which the die is mounted; and
    a plurality of bond wires linking circuitry on the integrated circuit die to the wire bond pads in the routable metal layer, forming electrical connections between the integrated circuit die and the routable metal layer.

2. The integrated circuit assembly of claim 1, further comprising a continuous sacrificial metal strip upon which a plurality of die packages are formed, each die package including an integrated circuit die and a routable metal layer.

3. The integrated circuit assembly of claim 1, further comprising an overfill material encapsulating at least the integrated circuit die and the plurality of bond wires.

4. The integrated circuit assembly of claim 3, wherein the overfill material further fills at least some gaps between the metal traces in the routable metal layer.

5. The integrated circuit assembly of claim 1, wherein a plurality of solder balls are formed on exposed solder ball regions of the routable metal layer.

6. The integrated circuit assembly of claim 5, wherein at least one of solder stop or a solder mask are used to constrain solder from flowing onto the metal traces during attaching the solder balls to the exposed solder ball regions of the routable metal layer.

7. The integrated circuit assembly of claim 1, wherein the metal traces are routed under the area on which the die is adhesively attached to the routable metal layer.

8. The integrated circuit assembly of claim 7, wherein the electrically nonconductive adhesive layer fills gaps between two or more metal traces routed in the routable metal layer under the area on which the die is adhesively attached to the routable metal layer.

9. The integrated circuit assembly of claim 1, wherein the routable metal layer comprises layers of metal in a metal stack, the layers of metal comprising:
    a top surface including a wire-bondable metal that is selected from the group consisting of palladium and silver,
    a layer of diffusion barrier metal including nickel immediately below the top surface,
    a layer of conductive metal including copper immediately below the layer of diffusion barrier metal,
    a layer of solder diffusion barrier metal including nickel below the layer of conductive metal, and
    a bottom layer including a layer of oxidation prevention metal that is selected from the group consisting of palladium and silver.

10. The integrated circuit assembly of claim 5, wherein the exposed solder ball regions of the routable metal layer include a package pad.

11. The integrated circuit assembly of claim 1, wherein the metal traces are configured for coupling a subset of the wire bond pads to one another and to a package pad connected to an external power source such that a plurality of power and ground connections are provided between circuitry on the die and the external power source.

12. An integrated circuit assembly, comprising:
an integrated circuit die;
a routable metal layer comprising metal traces configured for coupling wire bond pads to package pads, the routable metal layer including at least a pair of metal traces that directly couple a pair of wire bond pads to one another without an intervening package pad under an area on which the die is mounted, the package pads configured for mounting the die;
a plurality of solder balls formed on exposed solder ball regions of the routable metal layer; and
a ceramic encasing configured for encasing the integrated circuit assembly.

13. The integrated circuit assembly of claim 12, wherein the plurality of solder balls electrically couple the integrated circuit assembly to a printed circuit board.

14. The integrated circuit assembly of claim 12, wherein the routable metal layer includes layers of metal, the layers of metal comprising:
a top surface including a wire-bondable metal, the wire-bondable metal being selected from a group including palladium and silver,
a layer of diffusion barrier metal immediately below the top surface, the diffusion barrier metal including nickel,
a layer of conductive metal immediately below the layer of diffusion barrier metal, the conductive metal including copper,
a layer of solder diffusion barrier metal below the layer of conductive metal, the solder the diffusion barrier metal including nickel, and
a layer of oxidation prevention metal as a bottom layer, the oxidation prevention metal being selected from a group including palladium and silver.

15. The integrated circuit assembly of claim 12, wherein the exposed solder ball regions of the routable metal layer include a package pad.

16. The integrated circuit assembly of claim 12, wherein the metal traces are configured for coupling a subset of the wire bond pads to one another and to a package pad connected to an external power source such that a plurality of power and ground connections are provided between circuitry on the die and the external power source.

17. The integrated circuit assembly of claim 16, wherein one or more solder balls are connected to the external power source and to the wire bond pads coupled to one another such that the plurality of power and ground connections are provided between circuitry on the integrated circuit die and the external power source.

18. An integrated circuit assembly, comprising:
an integrated circuit die; and
a routable metal layer including metal traces configured for coupling wire bond pads to package pads, the package pads being configured as a mount for the integrated circuit die, the routable metal layer including at least a pair of metal traces that directly couple a pair of wire bond pads to one another without an intervening package pad under an area on which the integrated circuit die is mounted.

19. The integrated circuit assembly of claim 18, comprising:
a plurality of solder balls formed on exposed solder ball regions on the package pads, the plurality of solder balls including a solder ball that is connected to an external power source and attached to a package pad that is coupled to a subset of the wire bond pads using the metal traces such that electrical and ground connections are provided to circuitry on the integrated circuit die that are connected to the subset of the wire bond pads.

* * * * *